(12) United States Patent
Li et al.

(10) Patent No.: US 10,672,459 B2
(45) Date of Patent: Jun. 2, 2020

(54) TRANSITION COUPLING CIRCUITRY FOR MEMORY APPLICATIONS

(71) Applicant: Arm Limted, Cambridge (GB)

(72) Inventors: Yicong Li, Austin, TX (US); Andy Wangkun Chen, Austin, TX (US); Sharryl Renee Dettmer, Austin, TX (US); Lalit Gupta, Cupertino, CA (US); Jitendra Dasani, Cupertino, CA (US); Yeon Jun Park, San Jose, CA (US); Shri Sagar Dwivedi, San Jose, CA (US); Fakhruddin Ali Bohra, San Jose, CA (US)

(73) Assignee: Arm Limited, Cambridge (GB)

( * ) Notice: Subject to any disclaimer, the term of this patent is extended or adjusted under 35 U.S.C. 154(b) by 12 days.

(21) Appl. No.: 15/891,212

(22) Filed: Feb. 7, 2018

(65) Prior Publication Data

US 2019/0244656 A1 Aug. 8, 2019

(51) Int. Cl.
| | |
|---|---|
| G11C 8/16 | (2006.01) |
| G11C 11/4097 | (2006.01) |
| H01L 27/11 | (2006.01) |
| G11C 11/419 | (2006.01) |
| G11C 7/18 | (2006.01) |
| G11C 7/10 | (2006.01) |
| G11C 7/12 | (2006.01) |
| G11C 5/06 | (2006.01) |

(52) U.S. Cl.
CPC .......... *G11C 11/4097* (2013.01); *G11C 5/063* (2013.01); *G11C 7/1012* (2013.01); *G11C 7/12* (2013.01); *G11C 7/18* (2013.01); *G11C 11/419* (2013.01); *H01L 27/1112* (2013.01); *G11C 2207/005* (2013.01)

(58) Field of Classification Search
CPC ........................................................ G11C 8/16
USPC .................................................... 365/230.05
See application file for complete search history.

(56) References Cited

U.S. PATENT DOCUMENTS

| 5,877,976 A | 3/1999 | Lattimore et al. |
| 6,980,462 B1 | 12/2005 | Ramesh et al. |
| 9,583,209 B1 | 2/2017 | Roy et al. |

(Continued)

OTHER PUBLICATIONS

Session 12 Overview: SRAM; ISSCC 2017, Session 12, Digest of Technical Papers; IEEE; Feb. 7, 2017.
Session 12 SRAM Visuals; IEEE; Feb. 2017.

*Primary Examiner* — Min Huang
(74) *Attorney, Agent, or Firm* — Pramudji Law Group PLLC; Ari Pramudji

(57) ABSTRACT

Various implementations described herein refer to an integrated circuit having memory circuitry. The memory circuitry may include a first array of bitcells accessible with a first bitline pair and a second array of bitcells accessible with a second bitline pair. The integrated circuit may include first transition coupling circuitry for accessing jumper bitline pairs and coupling the jumper bitline pairs to column multiplexer circuitry. The integrated circuit may include second transition coupling circuitry for accessing the first array of bitcells or the second array of bitcells and providing a data output signal to the jumper bitline pairs. The first bitline pair and the second bitline pair may be on a lower metal layer, and the jumper bitline pairs may be on a higher metal layer.

20 Claims, 10 Drawing Sheets

(56) References Cited

U.S. PATENT DOCUMENTS

| | | | |
|---|---|---|---|
| 2004/0125653 A1* | 7/2004 | Tran | G11C 11/5621 |
| | | | 365/185.22 |
| 2006/0256604 A1 | 11/2006 | Jacquet | |
| 2010/0271855 A1 | 10/2010 | Nirschl et al. | |
| 2011/0157965 A1* | 6/2011 | Nii | G11C 11/4125 |
| | | | 365/156 |
| 2011/0317477 A1* | 12/2011 | Liaw | G11C 8/16 |
| | | | 365/156 |
| 2013/0077375 A1* | 3/2013 | Liaw | H01L 27/0207 |
| | | | 365/72 |
| 2017/0186483 A1* | 6/2017 | Singh | G11C 11/419 |

\* cited by examiner

TRANSITION COUPLING CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits can be designed as memory. Due to transistor scaling in modern circuitry, geometric scaling of metal and via routing can increase back-end wire RC load (i.e., resistor-capacitor load), which can degrade SRAM operation speed (i.e., static random access memory operation speed). For instance, since transistor geometry is being scaled down, the metal geometry is also scaled down. As a result, resistance (R) of the metal geometry can become a significant issue with advanced nodes, so developing a bitline differential for a higher number of rows can be challenging. These challenging issues can adversely impact timing and precharging of large RC of the bitline. These challenging issues can impact cycle time and power.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory architecture that supports a higher number of rows to optimize power and timing including access time and cycle time. For instance, various implementations described herein utilize multiple bitlines (BL) on multiple different metal layers (e.g., Mx and Mx+y, where x=2, and y=2) to support long BL loads without sacrificing SRAM performance. In this instance, a single bank array (e.g., 256 bitcells/BL) may be separated into two segments (a first segment, e.g., an upper/top 128 rows, and a second segment, e.g., a lower/bot 128 rows) by an internal level mux logic that is placed in the middle of the SRAM array. Generally, bot refers to the term bottom. The BL of the first/second segments (i.e., top/bot segments) may be coupled to a first metal layer (Mx) and an output of the internal mux may be controlled by the MSB (i.e., most significant bit) of the row address, which controls the top (or upper) half of the array versus the bottom (or lower) half of the array. Since each top/bot segment may see only half of the row's diffusion capacitance (e.g., capacitance for 128 rows each), the capacitance may be split (e.g., Mx+DiffusionCap of 128 rows) RC/2+Mx+2). In some implementations, diffusion capacitance may be split-off from half of the bitcells, and a higher level metal Mx+y may have an effective lower RC combination, wherein its resistance capacitance product may be less. Since each memory segment may only include 128 cells/BL, the effective bitline (BL) load may be reduced significantly through this Mx+2 BL scheme. As described herein, various implementations provided herein utilize multiple metal layers for the bitline (BL) along with other components (e.g., one or more multiplexers, which maybe referred to as transistor structures), instead of utilizing only a single metal layer for the bitline (BL) as in conventional circuitry.

Various implementations of transition coupling circuitry for memory applications will now be described in more detail with reference to FIGS. 1-9.

Figure 1:
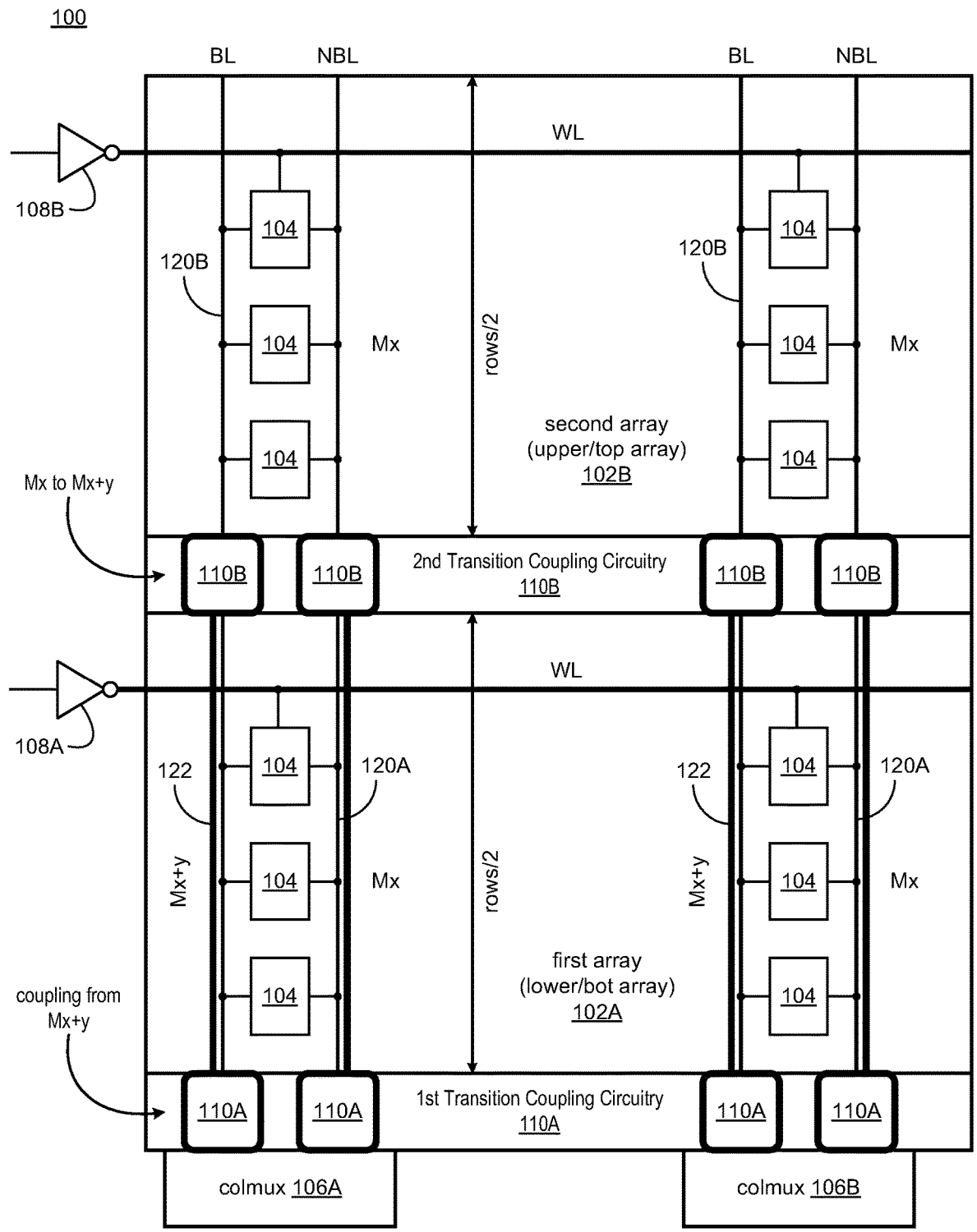
FIG. 1 illustrates a diagram of memory architecture in accordance with various implementations described herein.

FIG. 1 illustrates a block diagram of memory circuitry 100 in accordance with various implementations described herein.

As shown in FIG. 1, the memory circuitry 100 may include a plurality of control lines, including multiple bitlines BL, NBL. The multiple bitlines BL, NBL may include lower bitlines (BL lower, NBL lower) in a first array (or lower/bot array) 102A, which may be referred to as a first bitcell array or a first array of bitcells. The multiple bitlines BL, NBL may include upper bitlines (BL upper, NBL upper) in a second array (or upper/top array) 102B, which may be referred to as a second bitcell array or a second array of bitcells). The bitlines BL, NBL may be complementary bitlines, and the bitlines BL, NBL may also be referred to as bitline pairs, such as, e.g., read bitlines (RBL), write bitlines (WBL), or global bitlines (GBL). The bitlines BL, NBL may be coupled to wordlines WLs and column multiplexers (colmux) 106A, 106B, and the bitlines BL, NBL may be used to read/write one or more bits and/or bytes in memory, such as, e.g., one or more bitcells 104 in the first/lower/bot array 102A and/or in the second/upper/top array 102B. The column multiplexers (colmux 106A and colmux 106B) are shown depicting two column multiplexers at the two ends of the memory circuitry 100. In some cases, a width of a colmux may be dependent on a column decoding function. Column decoding may be as small as one column, but in practice, column decoding may be two or more columns of bitcells in multiples of 2, since there is a binary decoding. So, a typical colmux may be 2, 4, 8, 16, or 32 columns or bitline pairs wide depending on the column addressing. In some implementations, a colmux is multiplexing between multiple columns of bitcells. In the example of FIG. 1, the colmux 106A, 106B shows a single bitline pair input to the colmux. In some cases, a single bitline pair structure in a colmux may be referred to as single bitline wide. In other cases, a multi-bitline pair structure in a colmux may be used and may be referred to as multi-bitline wide. In addition, the memory circuitry 100 may include wordline drivers (WLDs) 108A, 108B that may be coupled to corresponding wordlines WLs. In some implementations, one or more of the plurality of control lines (bitlines BL, NBL) may be implemented in a separate metal or metallization layer, and as such, one or more of the bitlines BL, NBL may be routed in higher metallization layers to improve performance of the memory circuitry 100. In various implementations, the term multiplexer and column multiplexer may refer to transistor structures.

It should be understood that, although the terms first and second may be used herein to describe various components, these components should not be limited by these terms, because these terms are only used to distinguish one component from another. For instance, a first component may be termed a second component, and, similarly, a second component may be termed a first component. The first component and the second component are both components, respectively, but they are not to be considered the same component.

As shown, the memory circuitry 100 includes the first array of bitcells 102A (e.g., lower/bot bitcell array) that is accessible with a first bitline pair 120A (e.g., lower bitlines BL, NBL in the first/lower/bot array 102A). The memory circuitry 100 also includes the second array of bitcells 102B (e.g., upper/top bitcell array) that is accessible with a second bitline pair 120B (e.g., upper bitlines BL, NBL in the second/upper/top array 102B). The first bitline pair 120A is separate from the second bitline pair 120B. Further, the memory circuitry 100 includes a number of rows of the bitcells, and the first array of bitcells 102A (or first bitcell array) refers to a first half of the number of rows (e.g., rows/2), and the second array of bitcells 102B (or second bitcell array) refers to a second half of the number of rows (e.g., rows/2). In some implementations, the first array of bitcells 102A (e.g., lower/bot array 102A) may be disposed closer to (i.e., nearer to) the column multiplexer circuitry 106A, 106B than the second array of bitcells 102B (e.g., upper/top array 102B), which may be disposed further from the column multiplexer circuitry 106A, 106C than the first array of bitcells 102A. In some implementations, the first array of bitcells 102A is disposed between the first transition coupling circuitry 110A and the second transition coupling circuitry 110B, and the second array of bitcells 102B is disposed next to the second transition coupling circuitry 110B. In various instances, the first transition coupling circuitry 110A may be referred to as a first transition coupling cell or circuit, and the second transition coupling circuitry 110B may be referred to as a second transition coupling cell or circuit. Thus, the terms circuitry, cell, and circuit may be used interchangeably herein without altering the scope of its structure.

The memory circuitry 100 includes first transition coupling circuitry 110A for accessing jumper bitline pairs 122 and coupling them to the colmux 106A. Both the first array of bitcells 102A and the second array of bitcells 102B are coupled through the first transition coupling circuitry 110A to the colmux 106A. The first array of bitcells 102A may be coupled to the colmux through the first transition coupling circuitry 110A or through the second transition coupling circuitry 110B. The first array of bitcells 102A and the second array of bitcells 102B may be coupled to the column multiplexer circuitry 106A, 106B through the first transition coupling circuitry 110A. In some instances, the first transition coupling circuitry 110A may be coupled to the first bitline pair 120A on a lower metal layer (e.g., Mx), and the first transition coupling circuitry 110A may be coupled to the jumper bitline pairs 122 on a higher metal layer (e.g., Mx+y).

The memory circuitry 100 includes second transition coupling circuitry 110B for accessing either the first array of bitcells 102A or the second array of bitcells 102B and outputting the result to the jumper bitline pairs 122. The second array of bitcells may only be coupled to the first transition coupling circuitry 110A by being coupled first to the jumper bitline pairs 122 through the second transition coupling circuitry 110B.

Both the first transition coupling cell or circuitry 110A and the second transition coupling cell or circuitry 110B involve coupling bitlines from the one metal layer to another metal layer. The transition coupling cell or circuitry may take its one or more inputs from a signal on a lower level of metal and put its output on an higher level of metal or the transition coupling cell or circuitry may take its inputs from both a lower level of metal and an upper layer of metal with its one or more outputs on at least one of the two layers of metal. The utilization of the two different transition coupling cells or circuitry may always involve at least two different layers of metal for the bitlines and acts to reduce the bitline delay through a reduction of capacitance (C) or resistance-capacitance (RC). The coupling functions may be a combination of muxes that involve at least a via dot between the two layers of metal and may also include a transistor mux structure in addition to the via dot. The particular embodiments of the mux structures utilized provide significant performance advantages. In some implementations, the first bitline pair 120A may be referred to as a first path having first RC characteristics. The second bitline pair 120B may be referred to as a second path having second RC characteristics. The jumper bitline pairs 122 may be referred to as a jumper path having jumper RC characteristics. Further, a first sum of the first RC characteristics and the jumper RC characteristics may be less than a second sum of the first RC characteristics and the second RC characteristics.

The memory circuitry 100 includes first transition coupling circuitry 110A (e.g., 1st first transition coupling cell) that may be used for accessing the first array of bitcells 102A with the first bitline pair 120A. The first bitline pair 120A may be disposed in a first metal layer (Mx).

The memory circuitry 100 includes second transition coupling circuitry 110B (e.g., 2nd transition coupling cell) for accessing the first array of bitcells 102A or the second array of bitcells 102B with the second bitline pair 120B and a jumper bitline pair 122. In some instances, the second transition coupling circuitry 110B may access the first array of bitcells 102A or the second array of bitcells 102B and may provide a data output signal to the jumper bitline pairs 122. The second bitline pair 120B is disposed in the first metal layer (Mx), and the jumper bitline pair 122 is disposed in a second metal layer (Mx+y) that is different than the first metal layer (Mx). In some instances, the second array of bitcells 102B may be coupled to the first transition coupling circuitry 110A by way of the jumper bitline pairs 122 and through the second transition coupling circuitry 110B.

As further shown, the first transition coupling circuitry 110A (e.g., 1st transition coupling cell) may be disposed between the first array of bitcells 102A and the column multiplexer circuitry 106A, 106B, and the second transition coupling circuitry 110B (e.g., 2nd transition coupling cell) may be disposed between the first array of bitcells 102A (i.e., lower/bottom array) and the second array of bitcells 102B (i.e., upper/top array). As shown in FIG. 1, the first transition coupling circuitry 110A (e.g., 1st transition coupling cell) may be used to couple both of the bitlines 120A and the bitlines 122.

Figure 3:
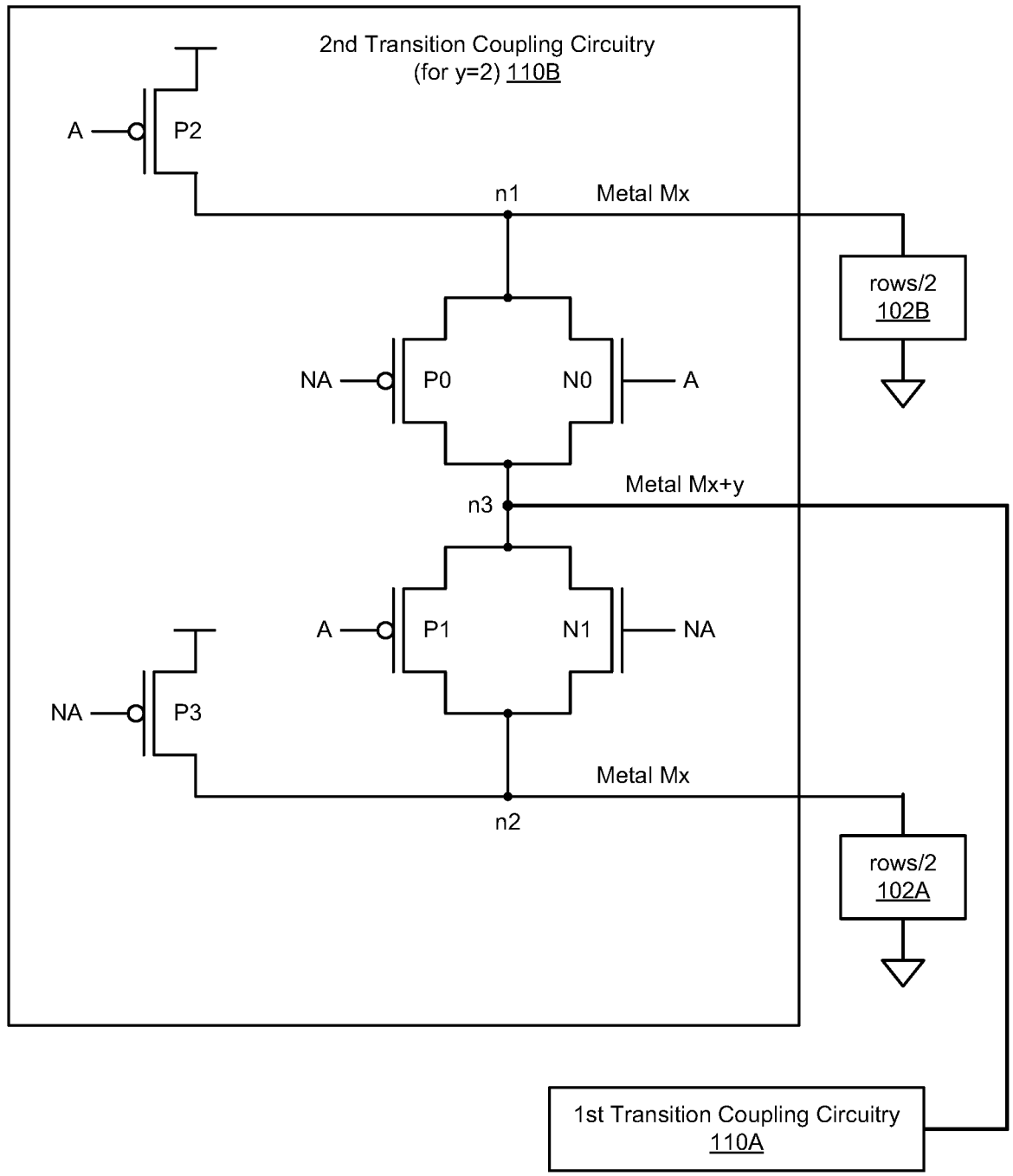
FIG. 3 illustrates a diagram of an embodiment of a transition coupling cell or circuitry in accordance with various implementations described herein.

The memory circuitry 100 includes column multiplexer circuitry (e.g., colmux 106A, 106B) coupled to the first array of bitcells 102A and the second array of bitcells 102B via the first and second transaction coupling circuitry 110A, 110B and the bitline pairs 120A, 120B, 122. For instance, the column multiplexer circuitry 106A, 106B may be coupled to the first array of bitcells 102A with the first transaction coupling circuitry 110A and the first bitline pair 120A, and the column multiplexer circuitry 106A, 106B may be coupled to the second array of bitcells 102B with the second transaction coupling circuitry 110B and the second bitline pair 120B and the jumper bitline pair 122. In some implementations, the first array of bitcells may also be coupled to the column multiplexer circuitry 106A, 106B through the second transition coupling circuitry 110B, e.g., in a manner as shown in FIG. 3. Further, in some cases, the first transition coupling circuitry 110A (e.g., 1st transition coupling cell) may be used to couple the bitline pair 120A to the colmux 106A, 106B. Still further, in some cases, the second transition coupling circuitry 110B (e.g., 2nd transition coupling cell) may be used to couple the bitline pairs 120B, 122 to the colmux 106A, 106B via the first transition coupling circuitry 110A (e.g., 1st transition coupling cell).

In some implementations, the memory circuitry 100 may include first transition coupling circuitry 110A for accessing jumper bitline pairs 122 and coupling them to the colmux 106A. The first array of bitcells 102A and the second array of bitcells 102B are coupled through the first transition coupling circuitry 110A to the colmux 106A. The first array 102A may be coupled to the colmux through the first transition coupling circuitry 110A or through the second transition coupling circuitry 110B.

The memory circuitry 100 may include second transition coupling circuitry 110B for accessing either the first array of bitcells 102A or the second array of bitcells 102B and outputting the result to the jumper bitline pairs 122. In some instances, the second array of bitcells may only be coupled to the first transition coupling circuitry 110A by being coupled first to the jumper bitline pairs 122 through the second transition coupling circuitry 110B.

Both the first transition coupling circuitry 110A and the second transition coupling circuitry 110B involve coupling bitlines from the one metal layer to another metal layer. The transition coupling cell or circuitry may take its one or more inputs from a signal on a lower level of metal and put its output on an higher level of metal or the coupling cell or circuitry may take its inputs from both a lower level of metal and an upper layer of metal with its one or more outputs on at least one of the two layers of metal. The utilization of the two different transition coupling cells or circuitry may always involve at least two different layers of metal for the bitlines and acts to reduce the bitline delay through a reduction of C or RC. The coupling functions may be a combination of muxes that involve at least a via dot between the two layers of metal and may also include a transistor mux structure in addition to the via dot. The particular embodiments of the mux structures utilized provide significant performance advantages.

The memory circuitry 100 including the bitcells 104 may be implemented as an integrated circuit (IC) with various types of memory, such as, e.g., RAM and/or other types of memory, including any type of volatile memory and non-volatile memory. The memory circuitry 100 and components therein may be implemented as an IC with single and/or dual rail memory architectures. Further, the memory circuitry 100 may be integrated with computing circuitry and related components on a single chip, and the memory circuitry 100 may be implemented in an embedded system for various types of electronic, mobile, and/or biometric applications.

Figure 2:
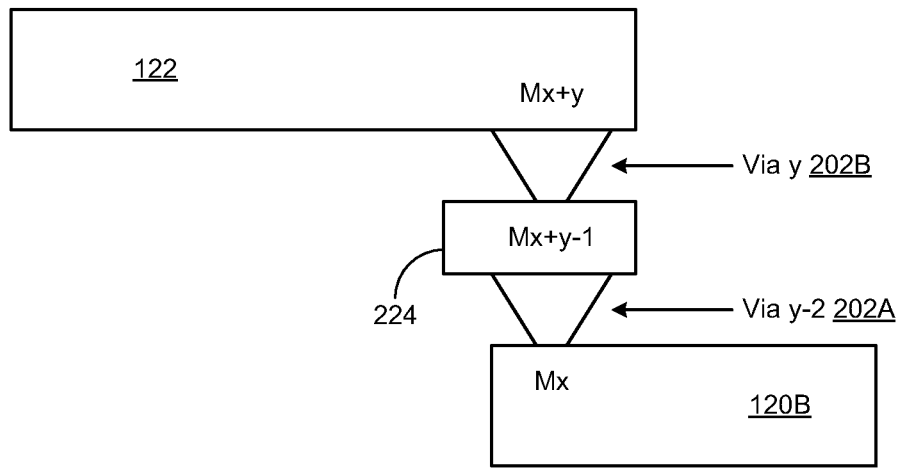
FIG. 2 illustrates a diagram of jumping multiple metal bitlines with vias in accordance with various implementations described herein.

FIG. 2 illustrates a diagram 200 of jumping multiple metal bitlines with vias in accordance with various implementations described herein.

As shown in FIG. 2, the jumper bitline pair 122 in the second metal layer (Mx+y) is coupled to the second bitline pair 120B in the first metal layer (Mx) with one or more vias 202A, 202B. In some instances, the first metal layer (Mx) may be referred to as a lower metal layer, and the second metal layer (Mx+y) may be referred to as a higher metal layer that is at a higher position in the stack than the first metal layer (Mx). As shown, an intermediate bitline 224 in a third metal layer (Mx+y−1) may be used between the vias 202A, 202B such that the second bitline 120B is coupled to the intermediate bitline 224 with a first via 202A, and the intermediate bitline 224 is also coupled to the jumper bitline 122 with a second via 202B. In various implementations, the intermediate bitline 224 may be embodied as a metal layer, a via, a bitline, or some part of thereof having a width of a via or a bitline. In other implementations, if there is a metal layer that is part of a via between 122 and 120B, it may be considered to be part of a coupling via. A bitline may be a line with multiple bitcells coupled thereto, or a second wire that travels multiple bitcells for coupling to an output. A small piece of metal that serves as part of a via may be referred to as a via, it is part of a bitline connector.

In some implementations, the diagram 200 in FIG. 2 refers to the first transition coupling circuitry 110A (e.g., 1st transition coupling cell). However, in other implementations, the diagram 200 in FIG. 2 may refer to the second transition coupling circuitry 110B (e.g., 2nd transition coupling cell). The first transition coupling circuitry 110A goes from Mx+y to Mx through vias and Mx+y−1 layer to couple with the colmux.

FIG. 3 illustrates a diagram 300 of an embodiment of a transition coupling cell or circuitry in accordance with various implementations described herein.

As shown in FIG. 3, the arrays of bitcells 102A, 102B may be coupled through the second transition coupling circuitry 110B to the bitlines 122. In FIG. 3, the arrays of bitcells 102B and 102A are coupled to the bitlines 122 through a two-to-one (2:1) multiplexer whose output node is N3. Bleeder devices are also included in the second transition coupling circuitry 110B. The bleeder devices are used to prevent (or at least inhibit) the non-accessed half of bitcells (e.g., either 102A or 102B) from leaking the bitlines below their pre-charged value. Further, in one implementation, the multiplexer and bleeder devices of the second transition coupling circuitry 110B may include a first P-type transistor P0 coupled in parallel with a first N-type transistor N0, and a first bleeder P-type transistor P2 may be coupled thereto at a first node n1. The first bleeder transistor P2 is further coupled to the second/upper/top array 102B (or upper half of rows, i.e., upper rows/2) in the first metal layer (Mx). As further shown in FIG. 3, the second transition coupling circuitry 110B may include a second P-type transistor P1 coupled in parallel with a second N-type transistor N1, and a second bleeder P-type transistor P3 may be coupled thereto at a second node n2. The second bleeder transistor P3 is further coupled to the first array of bitcells (lower/bot array) 102A (or lower half of rows, i.e., lower rows/2) in the first metal layer (Mx). Further, the first transition coupling circuitry 110A is coupled between the parallel transistors at node n3 in the second or upper metal layer (Mx+y), and in some cases, this may only occur after the second level metal bitline 122 goes through the first transition coupling circuitry 110A. In this implementation, the first transition coupling circuitry 110A may be the via (e.g., combinational stack of 202A, 224, 202B) shown in FIG. 2. Complementary control signals A, NA may be coupled to gates of the transistors. For instance, a first control signal A may be coupled to transistors N0, P1, P2, and a second control signal NA may be coupled to transistors P0, N1, P3. The first bleeder transistor P2 and the second bleeder transistor P3 may be used to keep the unselected bitlines at their original pre-charge level. In some instances, P2 may be used to hold a voltage level of unselected bitlines to VDD, and the bitlines may leak down when these rows are not accessed, e.g., if there were no P2 device included in the second transition coupling circuitry 110B. There may be separate bitline restore or pre-charge devices, and these devices may be used as structures to restore the bitlines to their normal precharge level after the bit lines have been discharged during a read or a write cycle.

In some implementations, the diagram 300 in FIG. 3 refers to the second transition coupling circuitry 110B (e.g., 2nd transition coupling cell). However, in some other implementations, the diagram 300 in FIG. 3 may refer to the first transition coupling circuitry 110A (e.g., 1st transition coupling cell).

Figure 4:
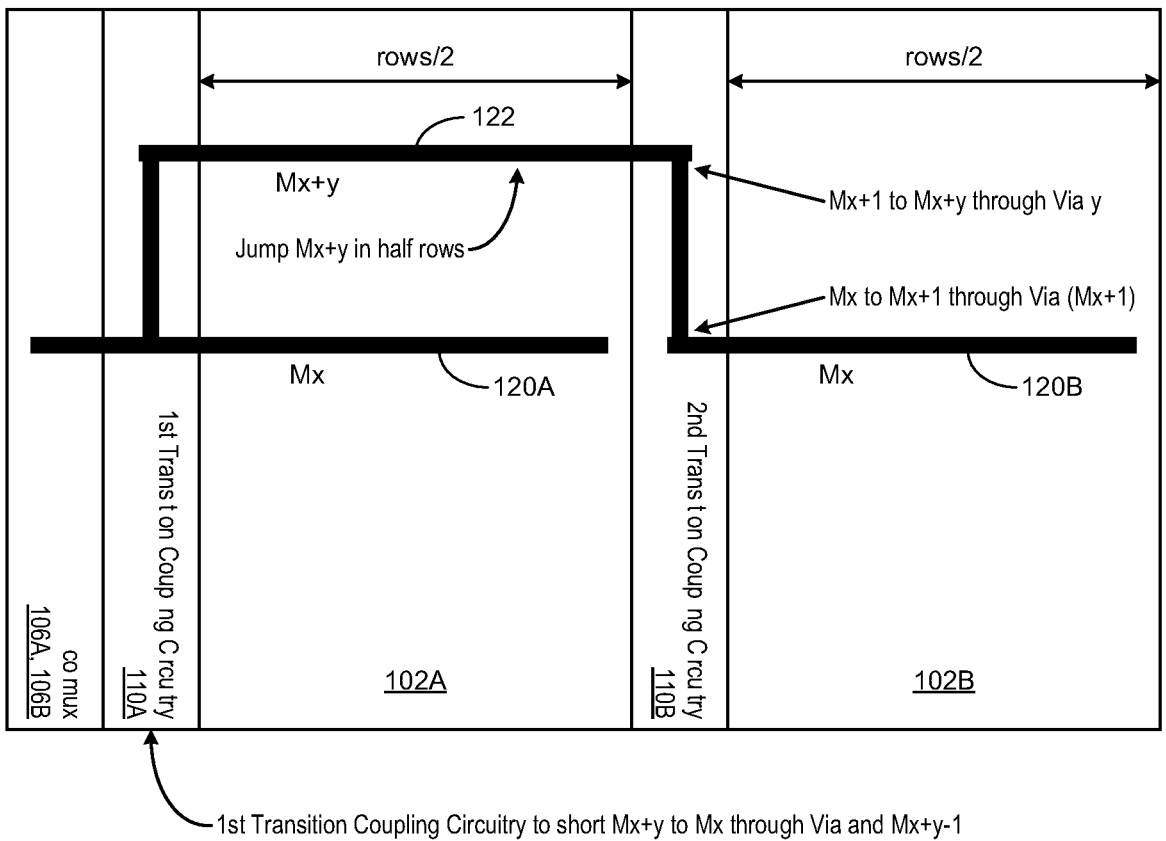
FIG. 4 illustrates a diagram of memory architecture having multiple transition coupling cells or circuitry in accordance with various implementations described herein.

FIG. 4 illustrates a diagram 400 of memory architecture having multiple transition coupling cells or circuitry in accordance with implementations described herein.

In some implementations, in reference to FIG. 4, the first and second transition coupling circuitry 110A, 110B may only use a dot or via, and there are no transistors included in the muxing of the first and second transition coupling circuitry 100A, 110B. For each half of the array of bitcells 102A or 102B, the capacitive load of the other array of bitcells (102B or 102A, respectively) is resistively isolated, and thus, performance of the bitline actively being read or written may be improved. For the first/bottom/lower array of bitcells 102A, the bitlines 122 and eventually the bitlines 120B are resistively isolated from the bitlines 120A, and thus the bitlines 120A see a lower resistance-capacitance (RC) path for its switching. Similarly, in reference to the second/top/upper array of bitcells 102B, the bitlines 120A are resistively isolated. One way to consider the effect is that the distribution of the read development signal from the second/top/upper bitcell in 102B gets to the first transition coupling circuitry 110A before it gets to the top cell of the first/bottom/lower array 102A. Because it gets to the first transition coupling circuitry 110A first or earlier, it allows the read signal to get to go through the first transition coupling circuitry 110A into the colmux earlier than if the whole RC distribution occurred on the path to the first transition coupling circuitry 110A and to the colmux, which passes the signal to a sense amp. In some instances, this may mean that the signal development is distributed furthest along the RC of 120A, where it is not critical. In some implementations, the first bitline pair 120A may refer to a first path having first RC characteristics. The second bitline pair 120B may refer to as a second path having second RC characteristics. The jumper bitline pairs 122 may refer to a jumper path having jumper RC characteristics. Further, a first sum of the first RC characteristics and the jumper RC characteristics may be less than a second sum of the first RC characteristics and the second RC characteristics.

As shown in FIG. 4, the column multiplexer 106A, 106B is coupled to the first array of bitcells 102A with the first bitline 120A in the first metal layer (Mx). The column multiplexer 106A, 106B is also coupled to the second array of bitcells 102B with the second bitline 120B in the first metal layer (Mx) by way of the jumper bitline 122 in the second metal layer (Mx+y). The transition coupling circuitry 110A, 110B may provide a path to jump between the first metal layer (Mx) to the second metal layer (Mx+y) in half rows (i.e., rows/2) or from the second metal layer (Mx+y) to the first metal layer (Mx). For instance, the first transition coupling circuitry 110A jumps the first bitline 120A in the first metal layer (Mx) to the jumper bitline 122 in the second metal layer (Mx+y), and the second transition coupling circuitry 110B jumps the jumper bitline 122 in the second metal layer (Mx+y) to the second bitline 120B in the first metal layer (Mx). The architecture for the transition coupling circuitry 110A, 110B is shown in FIGS. 2-3. This implementation passes through the higher metal layer (Mx+y) to reduce R on the bitline with no additional muxing. In some cases, the via connections in the transition coupling circuitry 110A, 110B may be part of a muxing path of "dotting" the two bit lines together. Hence, the coupling may be through a transistor mux, but it may also be through a via connection. In the embodiment in FIG. 4, the muxing may be provided through a via connection. The control signal that selects either the first/bottom/lower array or the second/top/upper array is the wordline selected through results of the row address decoding. The MSB bit may determine whether a wordline in the second/top/upper array or the first/bottom/lower array may become enabled and active to select a group of bitcells in one of the two arrays. As may be normal for a single port array, only one wordline out of multiple wordlines in both the first/top/upper array or second/bottom/lower array may become active in a given read or write cycle. In each case, the transition coupling circuitry 110A, 110B may perform functions of either via connections, transistor muxing, or both.

Figure 5A:
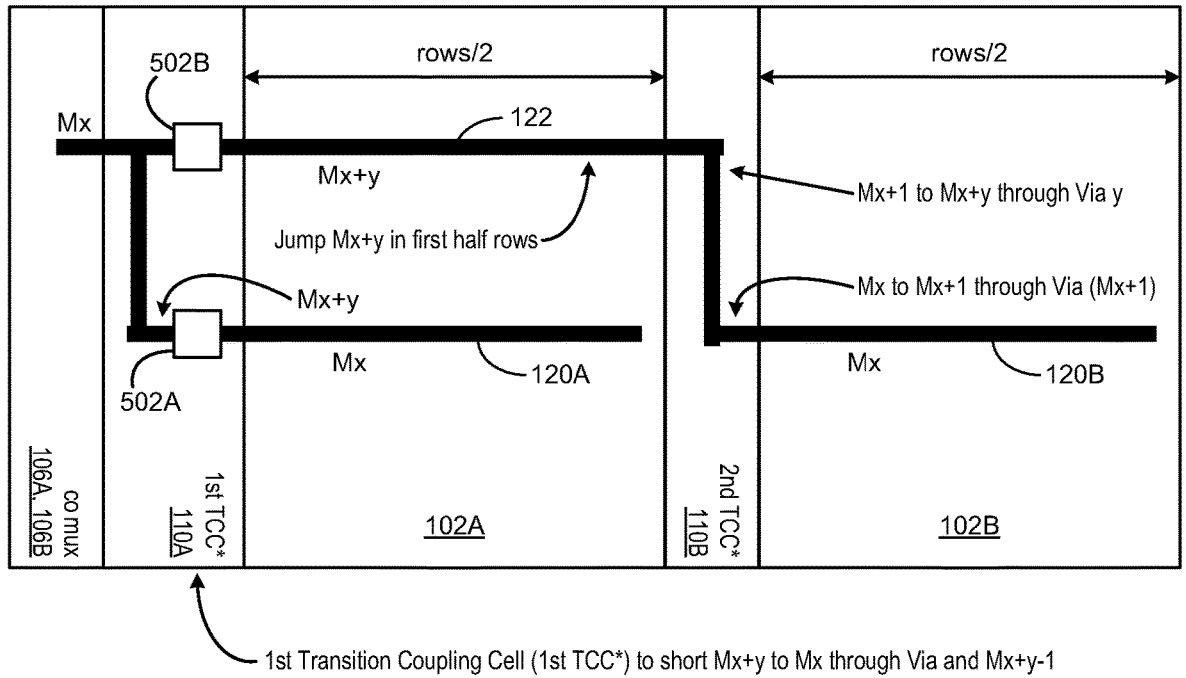
FIGS. 5A-5B illustrate diagrams of another embodiment of a transition coupling cell or circuitry in accordance with various implementations described herein.
Figure 5B:
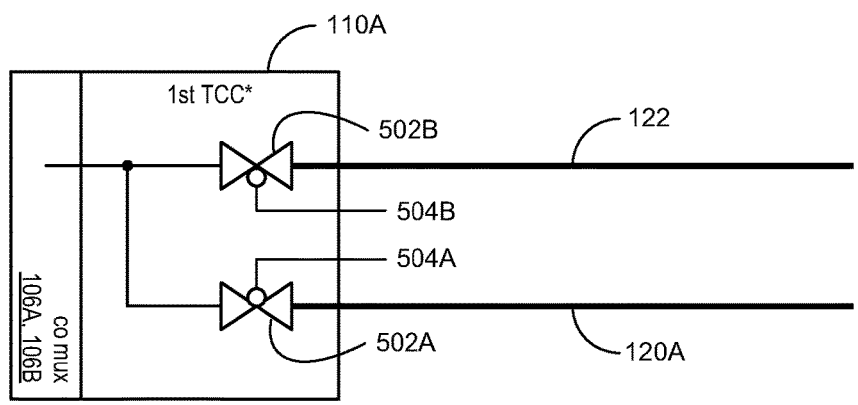

FIGS. 5A-5B illustrate various diagrams 500A, 500B of another embodiment of a transition coupling cell or circuitry in accordance with implementations described herein.

FIG. 5A shows the diagram 500A of an alternative embodiment for transition cell architecture with the first transition coupling circuitry (TCC) 110A. The array of bitcells 102B may have bitlines 120B coupled to bitline 122 through second transition coupling circuitry 110B. This second transition coupling circuitry 110B may couple bitline 120B to jumper bitline 122 through a via dot, as previously described herein above, e.g., in FIG. 2 or FIG. 4. The first transition coupling circuitry 110A may have a two-to-one transistor multiplexer with transistor structures (502A, 502B) and the outputs of the transistor structures on two different levels of metal. These outputs of the transistor structures (502A, 502B) are then connected through the via dot.

In FIG. 5B, the transistor structures 502A and 502B may include transmission gate transistor structures. For instance, as shown in the diagram 500B of FIG. 5B, the column multiplexer 106A, 106B may be coupled to the first bitline 120A with a first transmission gate 502A that is controlled with a first control signal 504A. Further, the column multiplexer 106A, 106B may also be coupled to the jumper bitline 122 with a second transmission gate 502B that is controlled with a second control signal 504B. This implementation for the transmission gate 502B passes through the higher metal layer (Mx+y) to reduce resistance (R) and/or reduce capacitance (C) by utilizing additional muxing at first transition coupling circuitry 110A (e.g., as shown in FIG. 5B), whose gate may be controlled by a MSB row address bit. Further, the first transition coupling circuitry (TCC) 110A may use muxing+the second transition coupling circuitry (TCC) 110B to thereby use the lower metal (Mx) to couple the second array (upper/top array) 102B with colmux 106A, 106B.

Figure 5C:
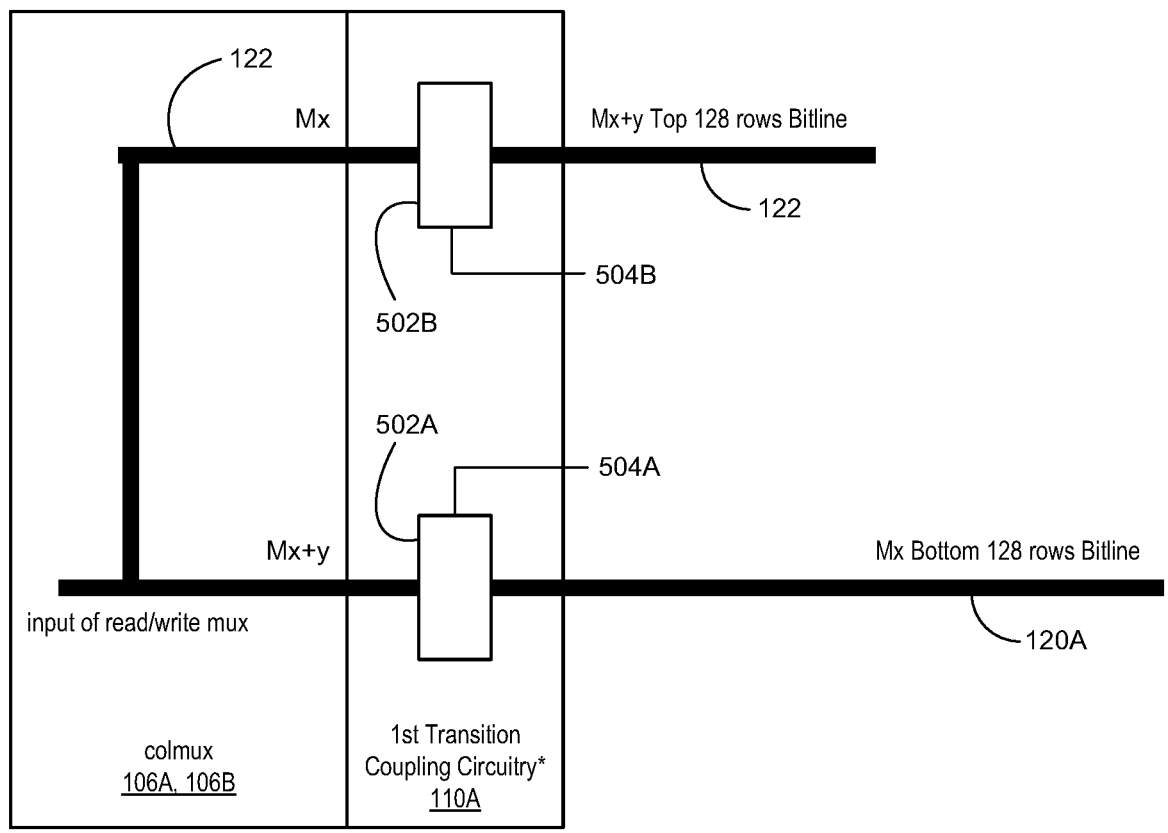
FIGS. 5C-5D illustrate diagrams of various embodiments of column multiplexers (or transistor structures for multiplexing) in accordance with various implementations described herein.
Figure 5D:
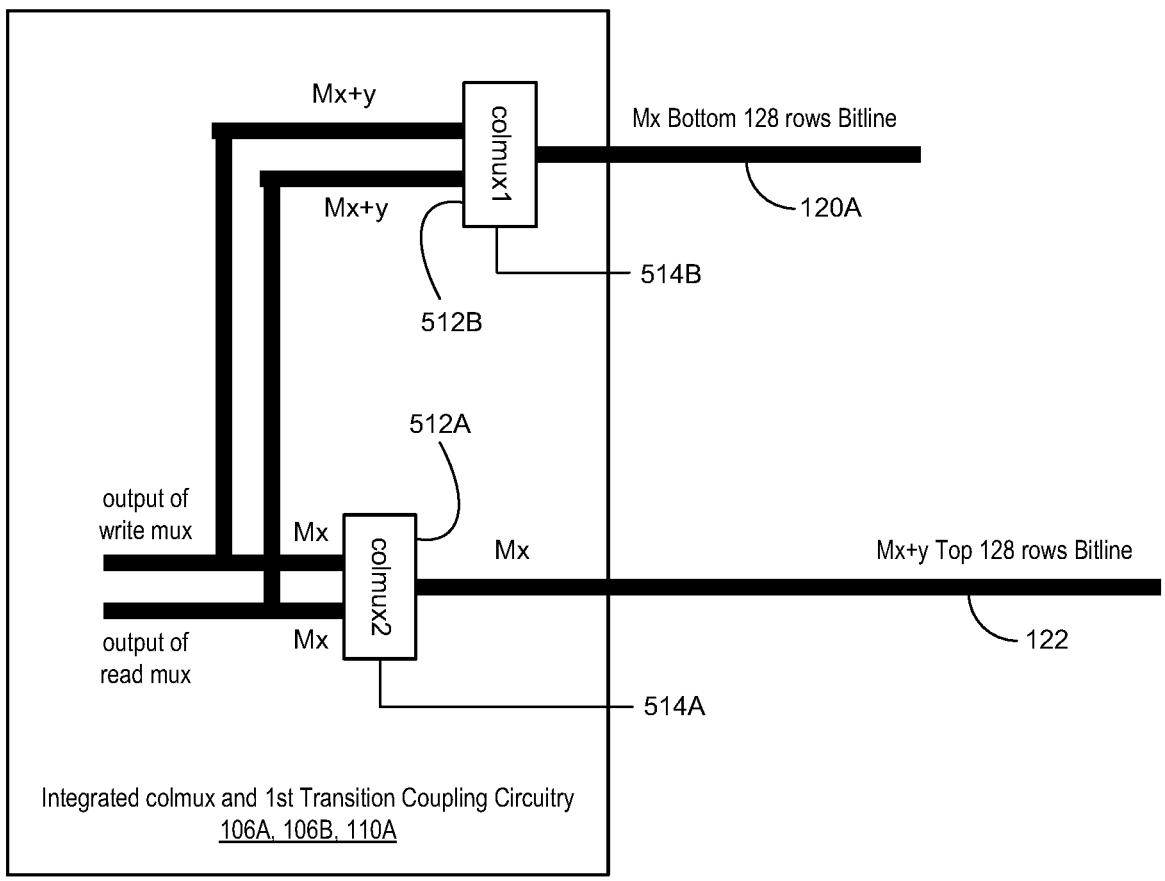

FIGS. 5C-5D illustrate various diagrams 500C, 500D of various embodiments of column multiplexers (or transistor structures for multiplexing) in accordance with implementations described herein.

FIG. 5C shows a diagram 500C of an alternative embodiment for the transition cell architecture of the first transition circuitry 110A (e.g., 1st transition coupling cell or circuitry*) and the column multiplexer 106A, 106B. The second transition coupling circuitry 110B is not shown, but it is the same as the second transition coupling circuitry 110B in FIG. 5A. As shown, the column multiplexer 106A, 106B may be coupled to the first bitline 120A with a first transistor structure 502A that is controlled with a first control signal 504A, and the column multiplexer 106A, 106B may also be coupled to the jumper bitline 122 with a second transistor structure 502B that is controlled with a second control signal 504B. The first and second transistor structures 502A, 502B may each be a portion of a multiplexer, such as, e.g., a two-to-one (2:1) multiplexer. The output signal of the two-to-one mux is a dot of the outputs of the two individual transistor structures. Also, as shown, the first and second transistor structures 502A, 502B may be configured to receive the input of the read/write mux as input signals and provide an output signal based on the received input signal.

In some instances, the first transition coupling circuitry 110A may include at least a portion of a multiplexer. In this instance, the multiplexer may include a first transistor structure having first inputs and first outputs, and the multiplexer may include a second transistor structure having second inputs and second outputs. The first inputs may be on a higher metal layer, the second inputs may be on a lower metal layer, the first outputs may be on the lower metal layer, and the second outputs are on the higher metal layer. In some cases, the first transition coupling circuitry 110A may further include a via dot, and the via dot may couple the first outputs to the second outputs. In other cases, the column multiplexer may include a via dot, and the via dot may couple the first outputs to the second outputs. The first transistor structure may include a first transistor transmission gate, and the second transistor structure may include a second transistor transmission gate. In some cases, the first transition coupling circuitry 110A may include a first via dot, and the first via dot may couple the first bitline pair 120A to the jumper bitline pairs 122, and the second transition coupling circuitry 110B may include a second via dot, and the second via dot may couple the second bitline pair 120B to the jumper bitline pairs 122. These and various other features are described in greater detail herein below.

Further, in some instances, the first array of bitcells 102A may include a first wordline control signal, and the second array of bitcells 102B may include a second wordline control signal. In some cases, each of the bitcells in the first array of bitcells 102A or the second array of bitcells 102B may further include stored data. Further, the first wordline control signal and the second wordline control signal may be configured to select the stored data associated with a selected bitcell in either the first array of bitcells 102A or the second array of bitcells 102B to pass through the first via dot. In some cases, the multiplexer may further include a control signal configured to select either the first transistor structure or the second transistor structure, and the first wordline control signal and the second wordline control signal may be configured to select bitcells in the first array of bitcells 102A and the second array of bitcells 102B, concurrently. These and various other features are described in greater detail herein below.

In some implementations, a difference between FIGS. 5B and 5C is where the "dot" occurs after the transistor mux. In FIGS. 5A and 5B, the dot occurs in the first transition coupling circuitry 110A, while in FIG. 5C, the dot occurs in the colmux area. This feature of FIG. 5C represents a slight variation indicated to show that this distinction may be a variation in various implementations described herein. It may not refer to a most important concept. In some instances, a most important concept or feature of FIGS. 5A-5C refers to the detail in FIG. 5C in reference to the metal layer differences.

In some implementations, in reference to FIG. 5C, a novel concept or feature associated with various implementations described herein may refer to the metal layer structure following the transmission gate or transistor structure portion of the mux prior to the via dot connection. The bitline 122 that is on layer Mx+y is transferred to layer Mx after the transistor structure portion of the mux 502B. The bitline 120A that is on layer Mx is transferred to layer Mx+y after the output of the transistor structure portion of the mux 502A. In some scenarios, one or both of the transistor structure portion of the muxes 502A, 502B may include transmission gate structures, including 2:1 transmission gate portions of a mux. In some mux structures, the output of both mux portions 502A, 502B may be either on a same metal layer as its input, or the output may be on a lower level of metal. In this implementation, the novel concept or feature is that the output of mux portion 502A is on layer Mx+y, which is a higher level metal than its input.

The benefits of this implementation are two-fold. For instance, one benefit may be that the wiring tracks of the outputs of the transistor structure portions of the mux 502B and 502A may be disposed on one wiring track in two different layers of metal, such as, e.g., higher and lower metal layers. This concept may allow for a smaller, more compact layout. If both outputs had been on layer Mx, then two wiring tracks may be needed. In addition, this concept may also provide a faster path for signals coming from bitcells in the bitcell array 102B. These are the bitcells whose signal has the furthest distance and thus the higher RC path to travel from the bitcell to the colmux. This structure allows or provides an optimum or minimum path for bitcells in the bitcell array 102B. The bitcells in the bitcell array 102A may have a shorter or lower RC path to the colmux, since they may only have an RC of the bitlines 120A. Further, this structure may then take the output of the portion of the mux 502A, which is in metal layer Mx+y, and which may cause an increased delay rather than if the structure remained on Mx. This increase in delay for the bitcell path from the bitcell array 102A to the colmux is still less than the path from bitcells in the bitcell array 102B through bitlines 120B on layer Mx, which are then coupled to bitlines 122 on layer Mx+y to mux 502B. Therefore, this unique metal structure that is placed after the portions of the mux 502A and 502B are combined to reduce or optimize the critical path for the bitcells in the bitcell array 102B, which is the longest delay path, while minimizing the layout area of the first transition coupling circuitry 110A and the layout of the colmux 106A, 106B.

FIG. 5D shows a diagram 500D of another alternative implementation for the transition cell architecture of the first transition coupling circuitry 110A (e.g., 1st transition coupling cell) and the column multiplexer 106A, 106B, which may be integrated together. The diagram 500D in FIG. 5D is similar to the diagram 500C in FIG. 5C, except that diagram 5D has read and write paths, and that the colmux and the first transition coupling circuitry 110A are integrated together.

As shown in FIG. 5D, the colmux may have a structure that introduces column muxing for column addressing and accessing both read and write paths. Some colmuxes in the industry have a single column mux for both the read and the write paths. Some colmuxes in the industry may have a separate mux for the read path and another mux for the write path. In FIG. 5D, a separate read and write path is shown so as to indicate that having a separate read and write path may be included in this implementation.

As shown in FIG. 5D, a first transistor structure 512A may be embodied as a first portion of a column multiplexer (i.e., colmux) that is controlled with a first control signal 514A, and the second transistor structure 512B may be embodied as a second portion of the column multiplexer that is controlled with a second control signal 514B. The first and second transistor structures 512A, 512B may include portions of both read and write multiplexers. A full column multiplexer may refer to a width of a number of columns being decoded in a column address. Details of how a read mux is different from a write mux is not included as this is a common practice in the art. It should be noted for completeness that control signals 514A and 514B must be a combination of the column addresses and the single bit of the row address (MSB) that chooses between the bitcells in the bitcell array 102A and the bitcells in the bitcell array 102B. As shown, the first and second transistor structures 512A, 512B may be configured to receive the output of a write mux as a first input signal and further receive the output of a read mux as a second input signal. Also, the first and second transistor structures 512A, 512B may be configured to provide an output signal based on the received first and second input signals. In this wiring structure, the metal layer wiring is intended to be similar to that of FIG. 5C. Although the inputs to 512B are on layer Mx for bitline 120A, the outputs are both on layer Mx+y. Further, although the inputs to 512A are on the layer Mx+y for the bitline 122, the outputs are both on layer Mx.

In some implementations, FIGS. 5A-5D, and in particular, FIGS. 5C and 5D, show specific wiring strategies that result in a higher performance and/or a smaller, more efficient layout. One concept described herein refers to a bitline in the Mx layer and another bitline in the Mx+y layer that may allow two lines to share a same wiring track. For instance, as bitline 122 enters the first transition coupling circuitry 110A, it is on layer Mx+y. In the first transition coupling circuitry 110A, the signal then goes through a portion of the transistor mux. The output of this transistor mux is on layer Mx. In another instance, the bitline 120A enters the first transition coupling circuitry 110A on layer Mx and then goes through its portion of the transistor mux whose output is on layer Mx+y. The two outputs are then coupled together through a via or dot to complete a mux function. One interesting feature is that a fastest RC path is used for signals associated with the top-half array 102B, since it has a longest distance to travel and therefore a largest RC path. In some instances, outputs of both portions of the transistor mux may be on the layer Mx; however, this may involve using additional space in a tightly packed bitcell pitch area.

This implementation may take an unusual tact of putting an output of a portion of the transistor mux (e.g., whose input was bitline 120A on layer Mx) up to layer Mx+y on the output of the mux, which is a slightly higher RC path for the lower half array 102A. However, since an overall RC path for the lower half array 102A is much less than the upper half array 102B, this additional RC adder may be implemented by moving up to layer Mx+y, which may be a better distribution of RC that may allow the most critical path of the upper half array 102B to be optimized. In some implementations, the first bitline pair 120A provides a first path having first RC characteristics, the second bitline pair 120B provides a second path having second RC characteristics, and the jumper bitline pairs 122 provide a jumper path having jumper RC characteristics. Further, a first sum of the first RC characteristics and the jumper RC characteristics may be less than a second sum of the first RC characteristics and the second RC characteristics.

In the implementations of FIGS. 5A, 5B, 5C, and 5D, one additional feature may refer to the use of transistor structures (502A and 502B or 512A and 512B) in the first transition coupling circuitry 110A, in that the control signals that activate one leg of the transistor structure (e.g., 502A or 502B) are mutually exclusive and are controlled by the MSB of the word address, as described herein above. This means that only one of the two transistor structures (e.g., either 502A/512A or 502B/512B, respectively) may be enabled during a read or write cycle. This feature allows a wordline decoding feature that may improve performance at the expense of additional power. For instance, a wordline may be activated in both the second/top/upper array and the second/bottom/lower array at the same read or write cycle. Having one less bit in the row decoding path may speed up the decode and allow the wordline to become active sooner in the cycle. This may happen at the cost of accessing both arrays and then having to restore the bitlines in both arrays, so more power may be required. However, decoding of the MSB may be completed for just the two-to-one multiplexer transistor structure in the first transition coupling circuitry 110A, which is not in the critical path. This is an additional feature in the various implementations of FIGS. 5A-5D, as well as the implementation of FIG. 3 for the second transition coupling circuitry 100B. For applications where power may be more important than a slight improvement in speed as described above, then only one wordline in total may be activated. This means that the low power implementation may require that the MSB is used in decoding the wordline for both arrays, e.g., first array and second array, and thus a total of only one wordline may become active in a cycle. Further, if a wordline in the second/top/upper array is selected in the low power option through full address decoding, then there may be no wordline selected or activated in the first/bottom/lower array.

Figure 6:
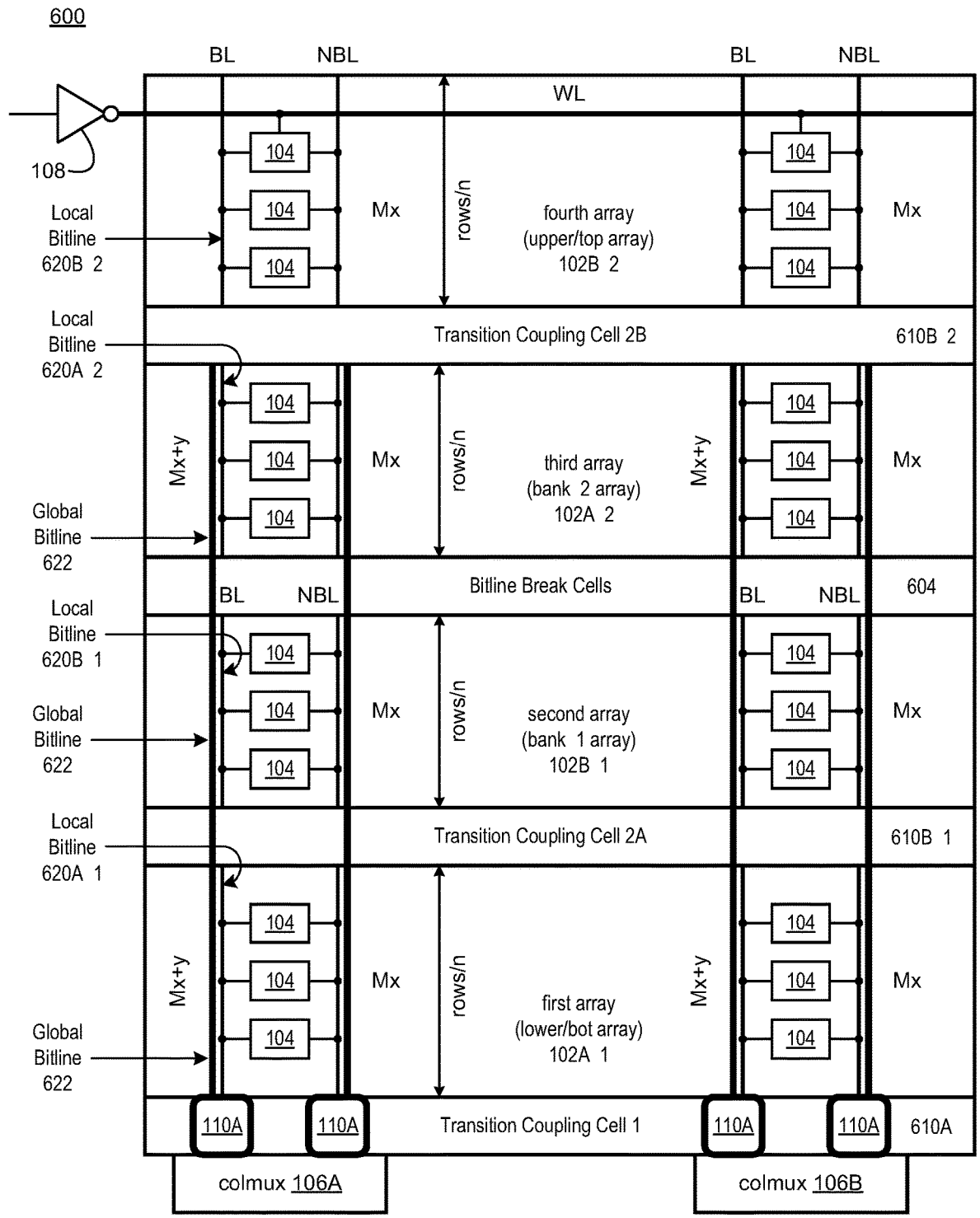
FIGS. 6-7 illustrate diagrams of various embodiments of memory architecture having multiple transition coupling cells or circuitry in accordance with implementations described herein.
Figure 7:
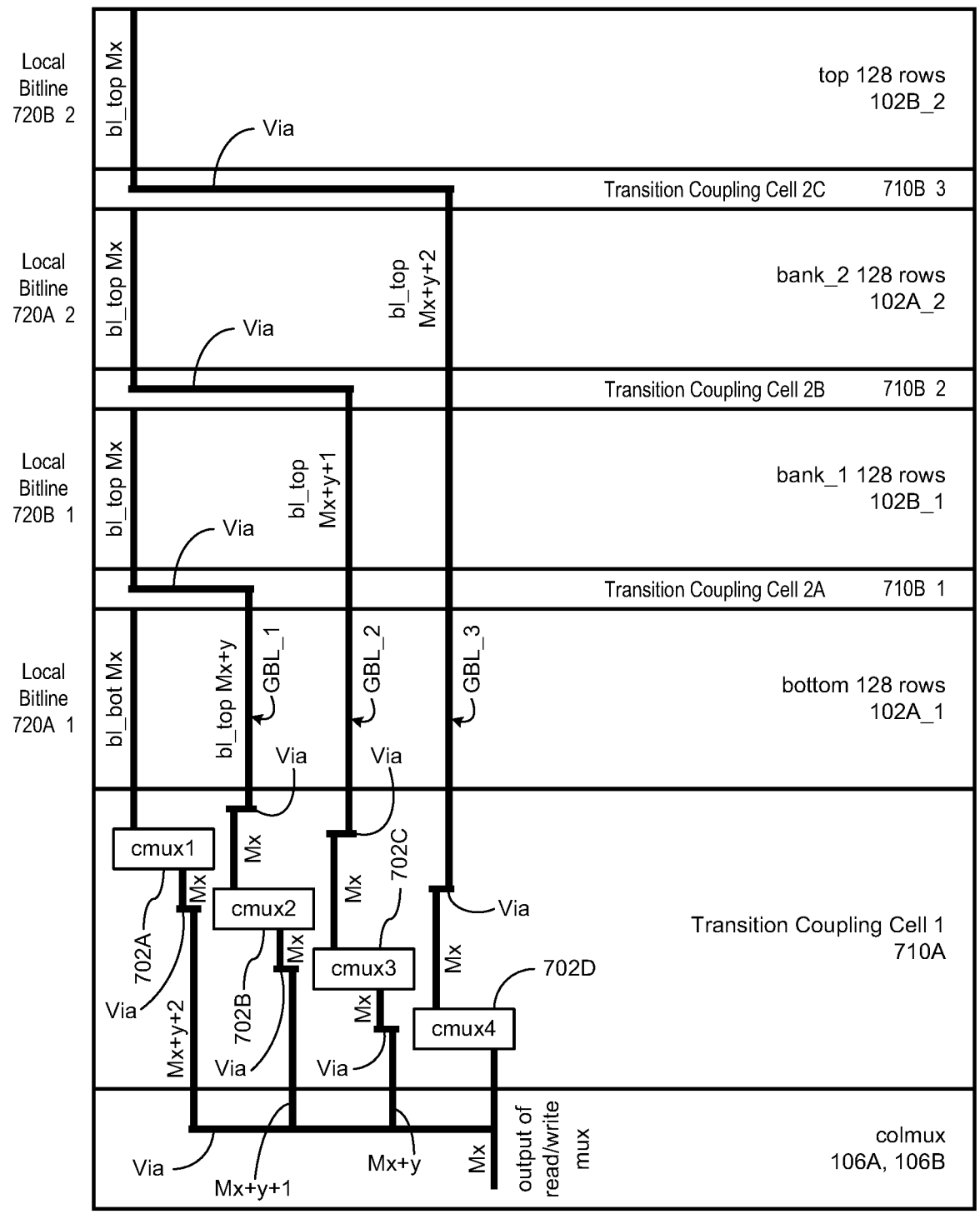

FIGS. 6-7 illustrate diagrams 600, 700 of various implementations of memory architecture having multiple transition coupling cells or circuitry in accordance with various implementations described herein.

FIG. 6 shows a diagram 600 of high density memory architecture that is capable of supporting a higher number of rows (e.g., 512 rows) by utilizing multiple transition coupling cells or circuitry 610A, 610B_1, 610B_2. In some instances, transition coupling cell or circuitry 610B_2 may best support how to implement the embodiment of FIG. 3 with multiple arrays.

The following is a description of FIG. 6 as an implementation of FIGS. 2 and 3 with multiple banks of arrays and multiple transition coupling circuitry. As such, the first and second transition coupling circuitry is described as transition coupling cells for ease of explanation. In FIG. 6, transition coupling cell 2A (610B_1) and transition coupling cell 2B (610B_2) are the same transition coupling cells as the second transition coupling circuitry 110B in FIG. 3. In some instances, each of these transition coupling cells forms a 2:1 transistor transmission mux between two bitcell arrays with local bitlines on layer Mx and gives the output on the global bitline (GBL) 622 on layer Layer Mx+y. The transition coupling cell 610B_1 couples the local bitlines 620A_1 (on layer Mx) and bitlines 620B_1 (on layer Mx) through the transistor transmission mux circuitry described in FIG. 3. They also include the bleeder transistors described in FIG. 3. Similarly, the transition coupling cell 610B_2 may couple local bitlines 620A_2 and 620B_2 to global bitline 622 through the transition coupling cell 2B (610B_2). The transition coupling cell 1 or 610A is the same as that of FIG. 2. This cell involves a via dot that transfers the global bitline 622 on layer Mx+y to layer Mx for input to the colmux 106A. In this extension of FIG. 3 into multiple banks, the local bitlines are most usually coupled to the global bitlines (GBLs) through a transistor transmission gate multiplexer. The global bitlines (GBLs) on layer Mx+y are brought down to layer Mx in the first transition coupling cell 1 (610A), which is analogous to FIG. 2.

The following is a description of FIG. 6 using the implementation of FIG. 4. In some scenarios, to incorporate the implementation of FIG. 4 may require that all the transition coupling cells are via dots. In FIG. 6, the transition coupling cell 2B (610B_2) may have a via dot between the two local bitlines 620A_2, 620B_2 and the global bitline 622. For transition coupling cell 2A, the local bitline 620B_1 may also be coupled to the global bitline 622 through a via dot. For transition coupling cell 1 (610A), this may have a via dot between the global bitline 622 and the local bitline 620A_1. Further, FIG. 6 may benefit in this implementation from the same performance advantages achieved through the use of the implementation in FIG. 4.

FIG. 6 shows memory architecture similar to FIGS. 1-3, where support for a higher number of rows (e.g., 512 rows) may be provided to assist with achieving a same bitline slew rate as the lower number of rows (e.g., 128 rows). In some implementations, the transition coupling cell 1 (610A) of FIG. 6 is similar to the first transition coupling circuitry 110A of FIGS. 1 and 2, and each of the transition coupling cells 2A, 2B (610B_1, 610B_2) of FIG. 6 is similar to the second transition coupling circuitry 110B of FIG. 1 and also the second transition coupling circuitry 110B that is shown in more detail in FIG. 3.

FIG. 7 includes multiple banks of arrays and multiple transition coupling circuitry, and as such, the first and second transition coupling circuitry is described as transition coupling cells for ease of explanation. FIG. 7 shows a diagram 700 of high density memory architecture that is capable of supporting a higher number of rows (e.g., 512 rows) by utilizing multiple transition coupling cells 1, 2A, 2B, 2C (i.e., 710A, 710B_1, 710B_2, 710B_3). The cmux (not shown) in 710B_1 may be implemented as the transistor structures 502A and 502A in FIGS. 5A and 5B or as the transistor structures 502A and 502B in FIG. 5C and as transistor structures 512A and 512B in FIG. 5D. In some implementations, FIG. 7 may work best with the implementations of FIGS. 5A-5D. However, FIG. 7 may also be used for FIG. 4. The use of cmux may include a transistor structure based on whether the implementation uses the scheme of FIG. 4 or FIG. 5. In addition, FIG. 7 shows a similar dotting structure in the output of the transistor structures as FIG. 5C. However, the dot (or via dot) of the output of 502A and 502B may be accomplished within the first transition coupling cell 710A. The dot connection on the outputs of cmux1, cmux2, cmux3, and cmux4 may be disposed in either colmux 106A, 106B as shown in FIGS. 5C and 5D or in first transition coupling circuitry 110A as shown in FIGS. 5A and 5B.

The memory architecture may include a first array of bitcells (lower/bot array) 102A_1, a second array of bitcells (bank_1 array) 102B_1, a third array of bitcells (bank_2 array) 102A_2, and a fourth array of bitcells (upper/top array) 102B_2. A first transition coupling circuitry 710A may be coupled between the colmuxes 106A, 106B and a bitline associated with each array of bitcells 102A_1, 102B_1, 102A_2, and 102B_2. The bitlines associated with the bitcells may be a local bitline (e.g., as in 720A_1) or the bitlines may be a global bitline GBL associated with GBL1, GBL2, or GBL3. This coupling may occur with both a transistor mux and via dot as in the implementation of FIGS. 5A, 5B, 5C, and 5D. In some implementations of FIG. 7, cmux1 (720A), cmux2 (720B), cmux3 (720C), and cmux4 (720D) may provide the same function as the portions of the transistor mux 502A and 502B (as shown in FIG. 5). In some implementations, cmux2 (720B), cmux3 (720C), and cmux4 (720D) may provide a same function as the via dot in transition coupling cell 1 in FIG. 4.

In some implementations, each of the other three transition coupling cells 710B_1, 710B_2, and 710B_3 may be embodied as a via dot that couples a local bitline on layer Mx and further couples it to a global bitline GBL on a higher level of metal such as Mx+y and layers above that. FIG. 7 shows the layers increasing by 1, but it may increase by 2, since most layers run orthogonal to each other. This means that M2 and M4 typically run in the same direction, while M1 and M3 run in a same direction but in a direction orthogonal to M2 and M4. A first transition coupling cell 710A (e.g., transition coupling cell 1) may be coupled between the colmux 106A, 106B and the first array of bitcells 102A_1. The bitlines of local bitline 720B_2 for bitcells associated with the fourth array of bitcells 102B_2 are coupled to GBL_3 (i.e., Global Bitline 3) through the transition coupling cell 2C (710B_3). The bitlines of local bitline 720A_2 for bitcells associated with the third array of bitcells 102A_2 are coupled to GBL_2 (i.e., Global Bitline 2) through the transition coupling cell 2B (710B_2). The bitlines of local bitline 720B_1 for bitcells associated with the second array of bitcells 102B_1 are coupled to GBL_1 (i.e., Global Bitline 1) through the transition coupling cell 2A (710B_1).

The memory architecture may include a local bitline bl_bot Mx that uses the first metal layer (Mx, e.g., where x=2) to couple the colmux to the first array of bitcells 102A_1 (e.g., bottom 128 rows) through the transition coupling cell 1 (720A) utilizing cmux1 with one or more vias.

The memory architecture may include a global bitline bl_top Mx+y that uses the second metal layer (Mx+y, e.g., where x=2 and y=2) and another local bitline bl_top Mx that uses the first metal layer (Mx, e.g., where x=2) to couple the colmux 106A, 106B to the second array of bitcells 102B_1 (e.g., bank_1 128 rows) through the transition coupling cell 1 (720A) utilizing cmux2 with one or more vias.

The memory architecture may include another global bitline bl_top Mx+y+1 that uses a third metal layer (Mx+y+1, e.g., where x=2 and y=2) and another local bitline bl_top Mx that uses the first metal layer (Mx, e.g., where x=2) to couple a third colmux (cmux3) to the third array of bitcells 102A_2 (e.g., bank_2 128 rows) with one or more vias.

The memory architecture may include another global bitline bl_top Mx+y+2 that uses a fourth metal layer (Mx+y+2, e.g., where x=2 and y=2) and another local bitline bl_top Mx that uses the first metal layer (Mx, e.g., where x=2) to couple a fourth colmux (cmux4) to the fourth array of bitcells 102B_2 (e.g., top 128 rows) with one or more vias.

As shown in FIG. 7, the portions of the multiplexer used in the transition coupling cell 1 (710A): cmux1, cmux2, cmux3, cmux4 may be configured to receive the output of the read/write mux as an input signal and then provide an output signal based on the received input signal.

FIG. 7 shows memory architecture similar to FIGS. 5A-5B, where support for a higher number of rows (e.g., 512 rows) may be provided to assist with achieving a same bitline slew rate at the lower number of rows (e.g., 128 rows). In some instances, the transition coupling cell 1 (710A) of FIG. 7 is similar to the first transition coupling circuitry 110A of FIG. 5C, wherein each of the transition coupling cells 2A, 2B, and 2C (710B_1, 710B_2, and 710B_3) of FIG. 7 is similar to the second transition coupling circuitry 110G of FIG. 5A, 5B, 5C or 5D.

Figure 8:
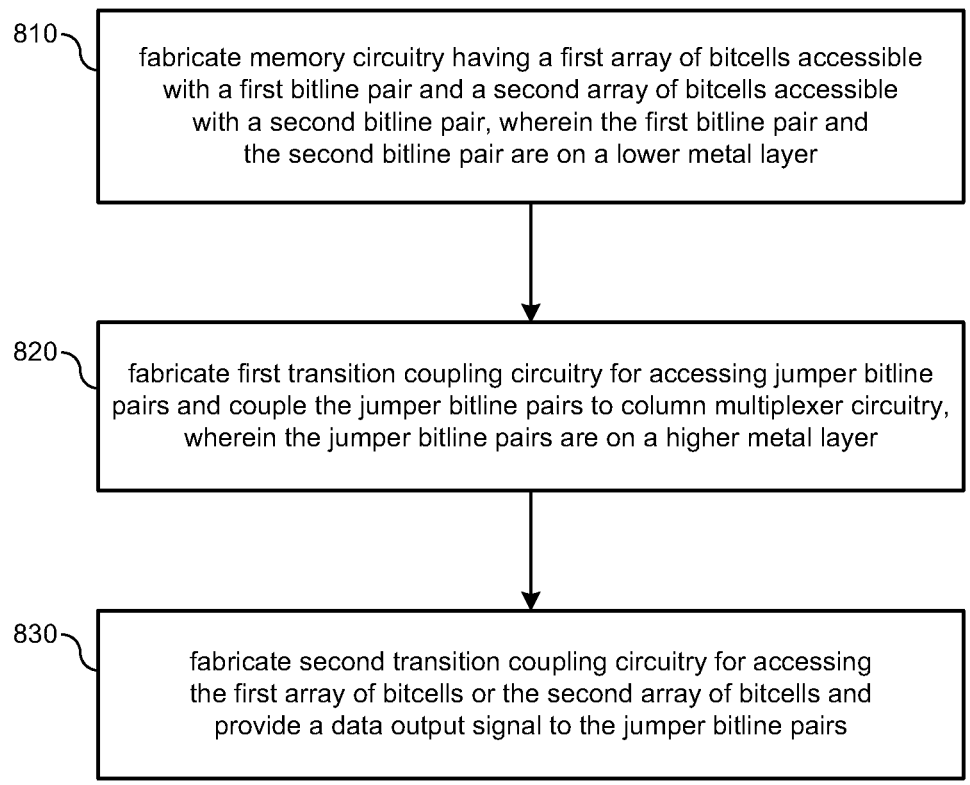
FIG. 8 illustrates a process flow of a method of fabricating transition coupling circuitry in accordance with various implementations described herein.

FIG. 8 illustrates a process diagram of a method 800 for fabricating transition coupling circuitry in accordance with various implementations described herein.

It should be understood that even though method 800 may indicate a particular order of operation execution, in some cases, various certain portions of the operations may be executed in a different order, and on different systems. In other cases, additional operations and/or steps may be added to and/or omitted from method 800. Further, method 800 may be implemented in hardware and/or software. If implemented in hardware, the method 800 may be implemented with various circuit components, such as described herein above in reference to FIGS. 1-7. If implemented in software, method 800 may be implemented as a program or software instruction process configured for implementing transition coupling circuitry as described herein. Further, if implemented in software, instructions related to implementing the method 800 may be stored in memory and/or a database. For instance, a computer or various other types of computing devices having a processor and memory may be configured to perform method 800.

As described and shown in reference to FIG. 8, method 800 may be utilized for manufacturing an integrated circuit (IC) that implements transition coupling circuitry in various types of memory applications. For instance, as described herein, the method 800 may be utilized for manufacturing transition coupling circuitry for memory applications, wherein the transition coupling circuitry may be programmable.

At block 810, method 800 may fabricate memory circuitry having a first array of bitcells accessible with a first bitline pair and a second array of bitcells accessible with a second bitline pair. The first bitline pair and the second bitline pair may be disposed on a lower metal layer.

At block 820, method 800 may fabricate first transition coupling circuitry for accessing jumper bitline pairs and coupling the jumper bitline pairs to column multiplexer circuitry. The jumper bitline pairs may be disposed on a higher metal layer. The first array of bitcells and the second array of bitcells may be coupled to the column multiplexer circuitry through the first transition coupling circuitry. The first array of bitcells (which may be referred to as a lower or bottom array of bitcells) may be disposed closer to the column multiplexer circuitry than the second array of bitcells (which may be referred to as a higher or top array of bitcells). The first transition coupling circuitry may be coupled to the first bitline pair on the lower metal layer and the jumper bitline pairs on the higher metal layer.

At block 830, method 800 may fabricate second transition coupling circuitry for accessing the first array of bitcells or the second array of bitcells and providing a data output signal to the jumper bitline pairs. The second array of bitcells may be coupled to the first transition coupling circuitry by way of the jumper bitline pairs and through the second transition coupling circuitry.

In some instances, method 800 may fabricate at least a portion of a multiplexer that is disposed in the first transition coupling circuitry. The multiplexer may include a first transistor structure having first inputs and first outputs and a second transistor structure having second inputs and second outputs. The first inputs may be on the higher metal layer, and the second inputs may be on the lower metal layer. The first outputs may be on the lower metal layer, and the second outputs may be on the higher metal layer.

In some instances, method 800 may fabricate a first via dot disposed in the first transition coupling circuitry, wherein the first via dot couples the first bitline pair to the jumper bitline pairs. Further, method 800 may fabricate a second via dot disposed in the second transition coupling circuitry, wherein the second via dot couples the second bitline pair to the jumper bitline pairs.

In some implementations, the first bitline pair may be embodied as a first path having first resistance-capacitance (RC) characteristics, and the second bitline pair may be embodied as a second path having second RC characteristics. Further, the jumper bitline pairs may be embodied as a jumper path having jumper RC characteristics, and a first sum of the first RC characteristics and the jumper RC characteristics may be less than a second sum of the first RC characteristics and the second RC characteristics.

Although particular embodiments have been described herein, it will be apparent that these particular embodiments should not be limited thereto, and that many modifications and/or additions may be made within the particular embodiments of the disclosure. For instance, various combinations of features of the dependent claims may be made with features of the independent claims without departing from the particular embodiments.

Further, various techniques of embodiments described herein are applicable across a variety of technologies, and for various different types of memory cells. For instance, particular embodiments may be used irrespective of whether individual memory cells are constructed using bulk CMOS (Complementary Metal-Oxide-Semiconductor) technology or constructed using SOI (Silicon-On-Insulator) technology or FinFET technology. Further, various techniques of embodiments described herein are not restricted to memory devices using memory cells, but may be applied to memory devices using various other types of memory cells that are subjected to read and/or write operations.

Still further, various techniques of embodiments described herein may be implemented with an NMOS matrix and NMOS keeper. However, in reference to CMOS technology, various techniques of embodiments described herein may be implemented with a PMOS matrix and a PMOS keeper. Therefore, various techniques of embodiments described herein refer to matching the device type of the keeper/bleeder with the device type of the matrix (i.e., the device type needing leakage compensation).

Described herein are various implementations of an integrated circuit. The integrated circuit may include memory circuitry having a first array of bitcells accessible with a first bitline pair and a second array of bitcells accessible with a second bitline pair. The integrated circuit may include first transition coupling circuitry for accessing jumper bitline pairs and coupling the jumper bitline pairs to column multiplexer circuitry. The integrated circuit may include second transition coupling circuitry for accessing the first array of bitcells or the second array of bitcells and providing a data output signal to the jumper bitline pairs. The first bitline pair and the second bitline pair may be on a lower metal layer, and the jumper bitline pairs may be on a higher metal layer.

In some implementations, the first array of bitcells and the second array of bitcells may be coupled to the column multiplexer circuitry through the first transition coupling circuitry. The first array of bitcells may be disposed closer to the column multiplexer circuitry than the second array of bitcells. The second array of bitcells may be coupled to the first transition coupling circuitry by way of the jumper bitline pairs and through the second transition coupling circuitry. The first transition coupling circuitry may be coupled to the first bitline pair on the lower metal layer and the jumper bitline pairs on the higher metal layer.

In some implementations, the first transition coupling circuitry may include at least a portion of a multiplexer. The multiplexer may include a first transistor structure having first inputs and first outputs. The multiplexer may include a second transistor structure having second inputs and second outputs. The first inputs may be on the higher metal layer. The second inputs may be on the lower metal layer. The first outputs may be on the lower metal layer. The second outputs may be on the higher metal layer.

In some implementations, the first transition coupling circuitry may include a via dot, and the via dot may couple the first outputs to the second outputs. The column multiplexer may include an additional portion of the multiplexor having a via dot, and the via dot may couple the first outputs to the second outputs. The first transistor structure may include a first transistor transmission gate, and the second transistor structure may include a second transistor transmission gate. The first transition coupling circuitry may include a first via dot, and the first via dot may couple the first bitline pair to the jumper bitline pairs. The second transition coupling circuitry may include a second via dot, and the second via dot may couple the second bitline pair to the jumper bitline pairs.

In some implementations, the first array of bitcells may include a first wordline control signal. The second array of bitcells may include a second wordline control signal. Each of the bitcells in the first array of bitcells or the second array of bitcells may have stored data. The first wordline control signal and the second wordline control signal may be configured to select the stored data associated with a selected bitcell in either the first array of bitcells or the second array of bitcells to pass through the first via dot.

In some implementations, the first array of bitcells may include a first wordline control signal. The second array of bitcells may include a second wordline control signal. The multiplexer may include a control signal that is configured to select either the first transistor structure or the second transistor structure. The first wordline control signal and the second wordline control signal may be configured to select bitcells in the first array and the second array concurrently.

Described herein are various implementations of a method for manufacturing (or fabricating) an integrated circuit. The method may include fabricating memory circuitry having a first array of bitcells accessible with a first bitline pair and a second array of bitcells accessible with a second bitline pair. The method may include fabricating first transition coupling circuitry for accessing jumper bitline pairs and coupling the jumper bitline pairs to column multiplexer circuitry. The method may include fabricating second transition coupling circuitry for accessing the first array of bitcells or the second array of bitcells and providing a data output signal to the jumper bitline pairs. The first bitline pair and the second bitline pair may be on a lower metal layer, and the jumper bitline pairs may be on a higher metal layer.

Described herein are various implementations of an integrated circuit. The integrated circuit may include memory circuitry having a first array of bitcells accessible with a first bitline pair and a second array of bitcells accessible with a second bitline pair. The first bitline pair may be separate from the second bitline pair. The integrated circuit may include first transition coupling circuitry for accessing the first array of bitcells with the first bitline pair and a jumper bitline pair. The first bitline pair may be disposed in a first metal layer. The integrated circuit may include second transition coupling circuitry for accessing the second array of bitcells with the second bitline pair and the jumper bitline pair. The second bitline pair may be disposed in the first metal layer, and the jumper bitline pair may be disposed in a second metal layer that is different than the first metal layer.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   memory circuitry having a first array of bitcells accessible with a first bitline pair and a second array of bitcells accessible with a second bitline pair;
   first transition coupling circuitry for accessing jumper bitline pairs and coupling the jumper bitline pairs to column multiplexer circuitry; and
   second transition coupling circuitry for accessing the first array of bitcells or the second array of bitcells and providing a data output signal to the jumper bitline pairs,
   wherein the first bitline pair and the second bitline pair are on a lower metal layer and the jumper bitline pairs are on a higher metal layer,
   wherein the first transition coupling circuitry has a first transistor structure with first outputs on the lower metal layer and a second transistor structure with second outputs on the higher metal layer, and
   wherein the first transition coupling circuitry has a via dot that couples the first outputs to the second outputs.

2. The integrated circuit of claim 1, wherein the first array of bitcells and the second array of bitcells are coupled to the column multiplexer circuitry through the first transition coupling circuitry.

3. The integrated circuit of claim 1, wherein the first array of bitcells are disposed closer to the column multiplexer circuitry than the second array of bitcells.

4. The integrated circuit of claim 1, wherein the second array of bitcells are coupled to the first transition coupling circuitry by way of the jumper bitline pairs and through the second transition coupling circuitry.

5. The integrated circuit of claim 1, wherein the first transition coupling circuitry is coupled to the first bitline pair on the lower metal layer and the jumper bitline pairs on the higher metal layer.

6. The integrated circuit of claim 5, wherein the first transition coupling circuitry further comprises at least a portion of a multiplexer comprising:
   the first transistor structure having first inputs and the first outputs; and
   the second transistor structure having second inputs and the second outputs, wherein:
   the first inputs are on the higher metal layer; and
   the second inputs are on the lower metal layer.

7. An integrated circuit, comprising:
   memory circuitry having a first array of bitcells accessible with a first bitline pair and a second array of bitcells accessible with a second bitline pair;
   first transition coupling circuitry for accessing jumper bitline pairs and coupling the jumper bitline pairs to column multiplexer circuitry; and
   second transition coupling circuitry for accessing the first array of bitcells or the second array of bitcells and providing a data output signal to the jumper bitline pairs,
   wherein the first bitline pair and the second bitline pair are on a lower metal layer and the jumper bitline pairs are on a higher metal layer,
   wherein the first transition coupling circuitry has a first transistor structure with first outputs on the lower metal layer and a second transistor structure with second outputs on the higher metal layer, and
   wherein the column multiplexer circuitry has an additional portion of a multiplexer comprising a via dot that couples the first outputs to the second outputs.

8. An integrated circuit, comprising:
   memory circuitry having a first array of bitcells accessible with a first bitline pair and a second array of bitcells accessible with a second bitline pair;
   first transition coupling circuitry for accessing jumper bitline pairs and coupling the jumper bitline pairs to column multiplexer circuitry; and
   second transition coupling circuitry for accessing the first array of bitcells or the second array of bitcells and providing a data output signal to the jumper bitline pairs,
   wherein the first bitline pair and the second bitline pair are on a lower metal layer and the jumper bitline pairs are on a higher metal layer,
   wherein the first transition coupling circuitry has a first transistor structure with first outputs on the lower metal layer and a second transistor structure with second outputs on the higher metal layer, and
   wherein the first transistor structure comprises a first transistor transmission gate, and the second transistor structure comprises a second transistor transmission gate.

9. The integrated circuit of claim 1, wherein the first transition coupling circuitry comprises a first via dot, and wherein the first via dot couples the first bitline pair to the jumper bitline pairs, and wherein the second transition coupling circuitry comprises a second via dot, and wherein the second via dot couples the second bitline pair to the jumper bitline pairs.

10. The integrated circuit of claim 9, wherein:
the first array of bitcells comprises a first wordline control signal,
the second array of bitcells comprises a second wordline control signal,
each of the bitcells in the first array of bitcells or the second array of bitcells further comprises stored data, and
the first wordline control signal and the second wordline control signal are configured to select the stored data associated with a selected bitcell in either the first array of bitcells or the second array of bitcells to pass through the first via dot.

11. An integrated circuit, comprising:
memory circuitry having a first array of bitcells accessible with a first bitline pair and a second array of bitcells accessible with a second bitline pair;
first transition coupling circuitry for accessing jumper bitline pairs and coupling the jumper bitline pairs to column multiplexer circuitry; and
second transition coupling circuitry for accessing the first array of bitcells or the second array of bitcells and providing a data output signal to the jumper bitline pairs,
wherein the first bitline pair and the second bitline pair are on a lower metal layer and the jumper bitline pairs are on a higher metal layer,
wherein the first transition coupling circuitry has at least a portion of a multiplexer with a first transistor structure having first outputs on the lower metal layer and a second transistor structure having second outputs on the higher metal layer,
wherein the first array of bitcells has a first wordline control signal;
wherein the second array of bitcells has a second wordline control signal;
wherein the multiplexer further comprises a control signal configured to select either the first transistor structure or the second transistor structure; and
wherein the first wordline control signal and the second wordline control signal are configured to select bitcells in the first array and the second array concurrently.

12. A method for manufacturing an integrated circuit, the method comprising:
fabricating memory circuitry having a first array of bitcells accessible with a first bitline pair and a second array of bitcells accessible with a second bitline pair;
fabricating first transition coupling circuitry for accessing jumper bitline pairs and coupling the jumper bitline pairs to column multiplexer circuitry; and
fabricating second transition coupling circuitry for accessing the first array of bitcells or the second array of bitcells and providing a data output signal to the jumper bitline pairs;
wherein the first bitline pair and the second bitline pair are on a lower metal layer and the jumper bitline pairs are on a higher metal layer,
wherein the first transition coupling circuitry has a first transistor structure with first outputs on the lower metal layer and a second transistor structure with second outputs on the higher metal layer, and
wherein the first transition coupling circuitry has a via dot that couples the first outputs to the second outputs.

13. The method of claim 12, wherein the first array of bitcells and the second array of bitcells are coupled to the column multiplexer circuitry through the first transition coupling circuitry.

14. The method of claim 12, wherein the first array of bitcells are coupled to the column multiplexer circuitry through the first transition coupling circuitry.

15. The method of claim 12, wherein the second array of bitcells are coupled to the first transition coupling circuitry by way of the jumper bitline pairs and through the second transition coupling circuitry.

16. The method of claim 12, wherein the first transition coupling circuitry is coupled to the first bitline pair on the lower metal layer and the jumper bitline pairs on the higher metal layer.

17. The method of claim 16, further comprising fabricating at least a portion of a multiplexer disposed in the first transition coupling circuitry, the multiplexer comprising:
the first transistor structure having first inputs and the first outputs; and
the second transistor structure having second inputs and the second outputs, wherein the:
the first inputs are on the higher metal layer; and
the second inputs are on the lower metal layer.

18. The method of claim 16, further comprising:
fabricating the via dot as a first via dot disposed in the first transition coupling circuitry, wherein the first via dot couples the first bitline pair to the jumper bitline pairs; and
fabricating a second via dot disposed in the second transition coupling circuitry, wherein the second via dot couples the second bitline pair to the jumper bitline pairs.

19. The method of claim 18, wherein:
the first bitline pair comprise a first path having first resistance-capacitance (RC) characteristics,
the second bitline pair comprise a second path having second RC characteristics,
the jumper bitline pairs comprise a jumper path having jumper RC characteristics, and
a first sum of the first RC characteristics and the jumper RC characteristics is less than a second sum of the first RC characteristics and the second RC characteristics.

20. An integrated circuit, comprising:
memory circuitry having a first array of bitcells accessible with a first bitline pair and a second array of bitcells accessible with a second bitline pair, wherein the first bitline pair is separate from the second bitline pair;
first transition coupling circuitry for accessing the first array of bitcells with the first bitline pair and a jumper bitline pair, wherein the first bitline pair is disposed in a first metal layer; and
second transition coupling circuitry for accessing the second array of bitcells with the second bitline pair and the jumper bitline pair, wherein the second bitline pair is disposed in the first metal layer, and wherein the jumper bitline pair is disposed in a second metal layer that is different than the first metal layer,
wherein the first transition coupling circuitry has a first transistor structure with first outputs on the first metal layer and a second transistor structure with second outputs on the second metal layer, and wherein the first transition coupling circuitry has a via dot that couples the first outputs to the second outputs.

* * * * *